(12) United States Patent
Wang et al.

(10) Patent No.: US 6,830,663 B2
(45) Date of Patent: Dec. 14, 2004

(54) METHOD FOR CREATING RADIAL PROFILES ON A SUBSTRATE

(75) Inventors: Youqi Wang, Atherton, CA (US); C. Eric Ramberg, San Jose, CA (US)

(73) Assignee: Symyx Technologies, Inc., Santa Clara, CA (US)

( * ) Notice: Subject to any disclaimer, the term of this patent is extended or adjusted under 35 U.S.C. 154(b) by 66 days.

(21) Appl. No.: 10/114,589

(22) Filed: Apr. 1, 2002

(65) Prior Publication Data

US 2002/0162740 A1 Nov. 7, 2002

Related U.S. Application Data

(63) Continuation-in-part of application No. 09/237,502, filed on Jan. 26, 1999, now Pat. No. 6,364,956.
(60) Provisional application No. 60/334,889, filed on Nov. 15, 2001.

(51) Int. Cl.[7] .............................................. C23C 14/34
(52) U.S. Cl. ............................ 204/192.1; 204/192.13; 204/192.15
(58) Field of Search ......................... 204/192.1, 192.13, 204/192.15

(56) References Cited

U.S. PATENT DOCUMENTS

| | | | |
|---|---|---|---|
| 4,121,537 A | 10/1978 | Maruyama et al. | |
| 4,389,295 A | 6/1983 | Davey et al. | |
| 4,776,868 A | 10/1988 | Trotter et al. | |
| 4,814,056 A | 3/1989 | Welty | |
| 5,091,320 A | 2/1992 | Aspnes et al. | |
| 5,314,597 A * | 5/1994 | Harra .................... | 204/192.13 |
| 5,556,472 A | 9/1996 | Nakamura et al. | |
| 5,798,027 A * | 8/1998 | Lefebvre et al. ....... | 204/192.26 |
| 6,045,671 A | 4/2000 | Wu et al. | |
| 6,051,113 A * | 4/2000 | Moslehi ................. | 204/192.12 |
| 6,063,436 A | 5/2000 | Pavell et al. | |
| 6,142,097 A | 11/2000 | Tomofuji | |

FOREIGN PATENT DOCUMENTS

| | | |
|---|---|---|
| FR | 1.409.289 | 7/1965 |
| WO | wo 98/47613 | 10/1998 |

OTHER PUBLICATIONS

E.M. DaSilva et al., "Vareiable Thin Film Thickness Apparatus", (IBM Technical Disclosure Bulletin vol. 22 No. 7, Dec. 1979) p 2922.
X.–D. Xiang et al. "A Combinatorial Approach to Materials Discovery" (Science vol. 268 Jun. 23, 1995) pp. 1738–1740.
X.–D. Xiang "Combinatorial Materials Synthesis and Screening" (Annu. Rev.Mater. Sci. 1999, vol. 29:pp. 149–171).

* cited by examiner

Primary Examiner—Bret Chen

(57) ABSTRACT

The present invention is directed to a method for depositing a radial profile of a target material onto a substrate. The method comprises directing one or more target materials toward a substrate, blocking some predetermined portion of the target material with at least a first shutter so that it does not strike the substrate, and rotating the substrate relative to the first shutter while the target material is directed toward the substrate so that a radial profile is formed on the substrate. In on embodiment, the substrate is rotated, and the first shutter does not rotate. In another embodiment, the first shutter rotates and the substrate does not rotate. The method permits a radial thickness or composition gradient on the substrate to be formed. The method may also include using one or more contact masks placed on the substrate during the deposition in order to mask off particular portions of the substrate during the deposition process.

31 Claims, 8 Drawing Sheets

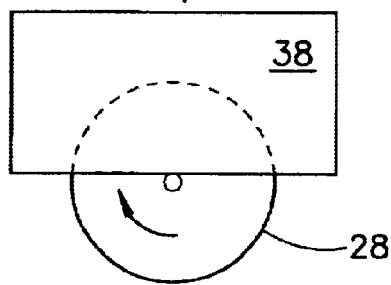
FIG. 4B
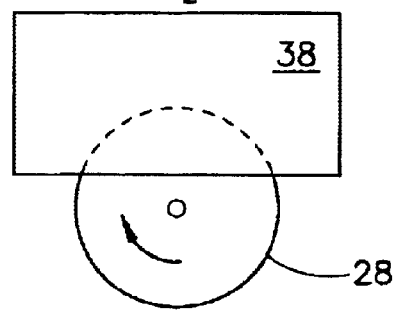
FIG. 4C
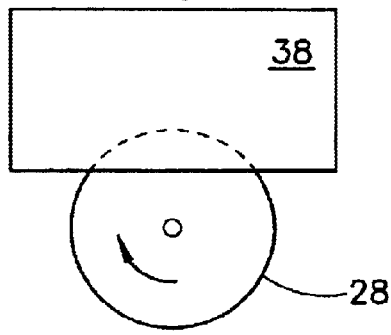
FIG. 4D
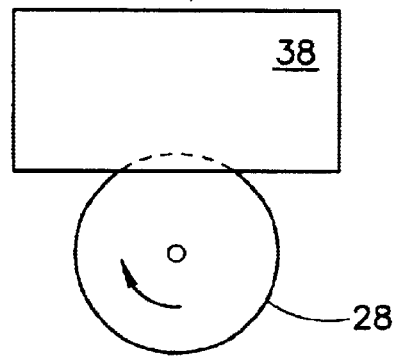
FIG. 4E
FIG. 5
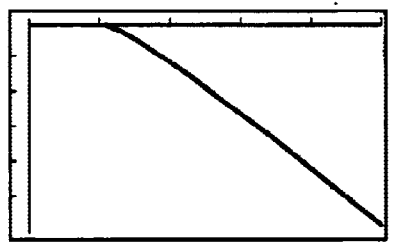
FIG. 6
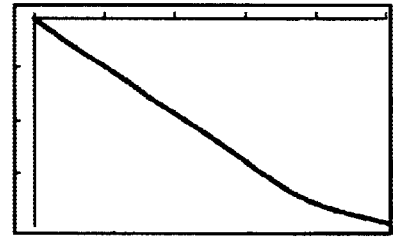
FIG. 7
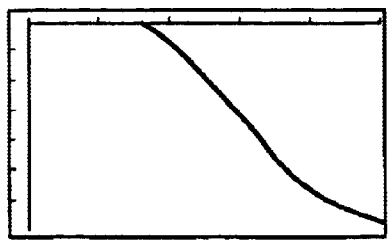
FIG. 8
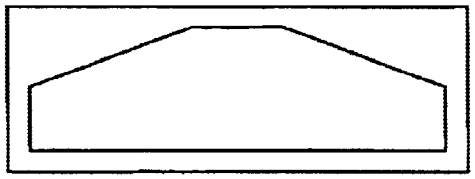

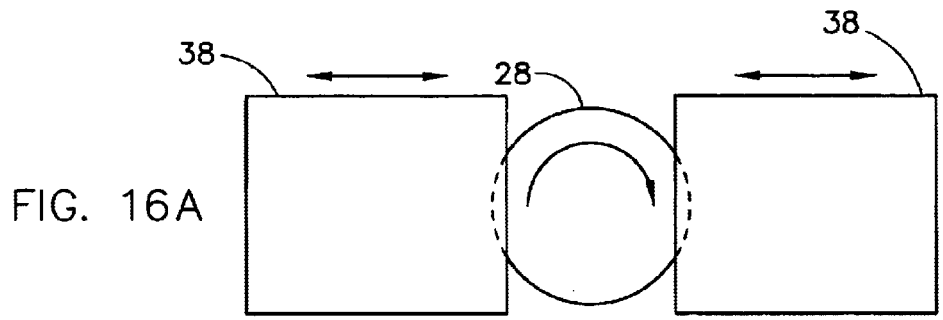
FIG. 16A
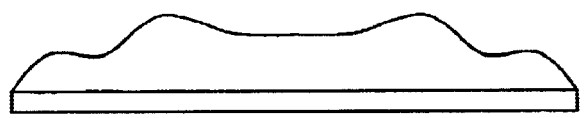
FIG. 16B
FIG. 17
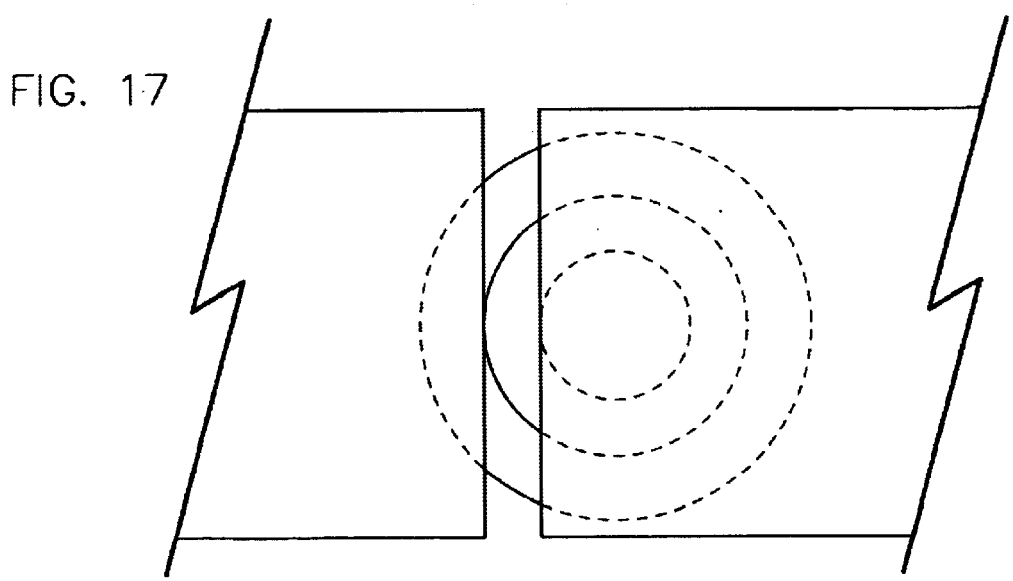

METHOD FOR CREATING RADIAL PROFILES ON A SUBSTRATE

RELATED APPLICATIONS

This application claims priority under 35 USC 119 and 120 from U.S. Provisional Patent Application Ser. No. 60/334.889, filed on Nov. 15, 2001 and entitled "Method and Apparatus for Creating Radial Symmetric Thickness and/or Composition Profiles on a Substrate" and is also a continuation in part of U.S. patent application Ser. No. 09/237,502, filed Jan. 29, 1999 and entitled "Programmable Flux Gradient Apparatus For Co-Deposition Of Materials Onto A Substrate" now U.S. Pat. No. 6,364,956.

BACKGROUND OF THE INVENTION

This invention relates generally to a system and method for depositing a target material on a substrate and in particular to a system and method for depositing a target material having a radial profile onto a substrate.

It is desirable to place radial thickness or composition profiles and/or gradients of target materials onto a substrate. A radial thickness profile or gradient is an amount of material being deposited in a radial manner (to form, for example, an annular ring around the substrate) onto the substrate. The thickness of that target material can be varied along the radius of the substrate to form the radial thickness gradients or other profiles of material. In prior systems, a particular portion of material is deposited onto a first portion of the substrate. Then, the substrate may be rotated to a second position and another particular portion of material is deposited onto the substrate with the substrate in the second position. Then the substrate may be rotated to a third position and the same process is repeated. In this manner, thickness gradients may be generated, but the gradients or other profiles are oriented with respect to specific directions on the substrate, such as along the legs of a triangle for a ternary system. Xiang, "Combinatorial Materials Synthesis and Screening: An Integrated Materials Chip Approach to Discovery and Optimization of Functional Materials", *Ann. Rev. Mater. Sci.* 1999, pgs. 149–171 (1999).

Thus, it is desirable to provide a method and apparatus for creating radial thickness or composition gradients or other radial symmetric profiles on a substrate that eliminates the above limitations with the conventional system and it is to this end that the present invention is directed.

SUMMARY OF THE INVENTION

The method and apparatus in accordance with the invention permits a radial thickness and/or composition gradient or other radial profile (including symmetric and asymmetric profiles) on a substrate to be formed wherein the gradients or profiles are not oriented in specific directions as is done with the prior systems. To accomplish the above, the system comprises one or more dynamic shutters (e.g., shutters that can be moved independently of each other and during the deposition of a material) in combination with equipment that permits rotation of the substrate relative to the shutter(s), or rotation of the shutter(s) relative to the substrate, during the deposition of the material onto the substrate. The equipment may also stop/start, continuously rotate at a constant speed or rotate the substrate at a variable speed during the deposition of the material to generate various different radial thickness or composition gradients or other arbitrary but radial profiles on the substrate (including symmetric and asymmetric profiles.) The system may also include one or more contact masks that may be placed on the substrate during the deposition in order to mask off particular portions of the substrate during the deposition process. The system may also include one or more deposition sources to perform deposition of substances. With multiple deposition sources, each source and shutter generates its own independent radial gradient or other arbitrary radial profile, such as a symmetric or asymmetric profiles. For convenience, the system is described in the context of rotation of the substrate, relative to non-rotating shutters. However, one skilled in the art will recognize that an equivalent system could be implemented, in which the substrate is fixed, and the dynamic shutter(s) are rotated around the substrate (as well as moved according to their other capabilities as described herein).

In accordance with the invention, the system causes a rotation of the substrate relative to the shutter(s) (e.g., the substrate is rotated and the shutter(s) are stationary or the shutter(s) rotate and the substrate is stationary) during deposition in order to induce a radial component into the thickness composition profile or composition gradient. For example, the substrate may be rotated sufficiently quickly, relative to the deposition rate, to create thickness profiles that are conical (e.g., low at the edges and higher in the middle of the substrate), reverse conical (e.g., low at the middle of the substrate and high at the edges of the substrate), concave, convex or any other radial profiles. The radial deposited component may be symmetric or asymmetric.

The parameters of the system in accordance with the invention may be varied in order to change the profiles being generated by the system. For example, the shutter shapes, the shutter positions, the shutter motion profiles, the substrate rotation speed and the substrate rotation centricity (whether or not the substrate is rotated about its center) can all be independently controlled and adjusted to generate various profiles, such as continuous gradients of discrete compositional regions or other desired film thickness profiles across the substrate.

In accordance with the invention, an apparatus for creating a radial profile of a target material on a substrate is provided. The apparatus comprises a deposition source for directing a target material toward a substrate and a shutter that blocks an amount of the target material from striking the substrate. The apparatus further comprises a rotatable platform that induces rotation of the substrate relative to the shutter system during the deposition of the target material and the shutter blocks a predetermined amount of the target material to generate a radial profile.

In accordance with another aspect of the invention, a method for deposition of a radial profile of a target material onto a substrate is provided. The method comprises directing target material toward a substrate, blocking some predetermined portion of the target material so that it does not strike the substrate, and rotating the substrate while the target material is directed toward the substrate so that a radial profile is formed on the substrate. In accordance with yet another aspect of the invention, a substrate comprises a target material formed on top of the substrate, the target material having a radial profile wherein the radial profile of the target material on the substrate is formed using at least one shutter that blocks a predetermined amount of target material while the substrate is being rotated.

BRIEF DESCRIPTION OF THE DRAWINGS

FIGS. 4B–4E illustrate the positions of the shutter relative to the substrate to generate the gradient shown in FIG. 4A;

FIG. 5 illustrates an example of a gradient profile from the center of rotation to one edge of substrate (e.g., half of the substrate) being generated by the apparatus shown in FIG. 1 when the shutter starts at the edge, moves toward the center, and does not reach the center of the substrate;

FIG. 6 illustrates an example of a gradient profile from the center of rotation to one edge of substrate (e.g., half of the substrate) being generated by the apparatus shown in FIG. 1 when the shutter starts at the center, moves toward the edge, and does not reach the edge of the substrate;

FIG. 7 illustrates an example of a gradient profile from the center of rotation to one edge of substrate (e.g., half of the substrate) being generated by the apparatus shown in FIG. 1 when the shutter does not start from the center and does not reach the edge of the substrate;

FIG. 8 illustrates an example of a gradient profile across the entire substrate being generated by the apparatus shown in FIG. 1 when the shutter starts at the edge, moves toward the center, and does not reach the center of the substrate;

FIG. 16A illustrates a two shutter embodiment of the apparatus that can also be used to generate the gradient shown in FIG. 15;

FIG. 16B illustrates an example of a profile across the entire substrate that may be generated using the apparatus shown in FIG. 16A;

FIG. 17 is a diagram illustrating an annular ring that may be generated using the deposition apparatus;

DETAILED DESCRIPTION OF A PREFERRED EMBODIMENT

Figure 1:
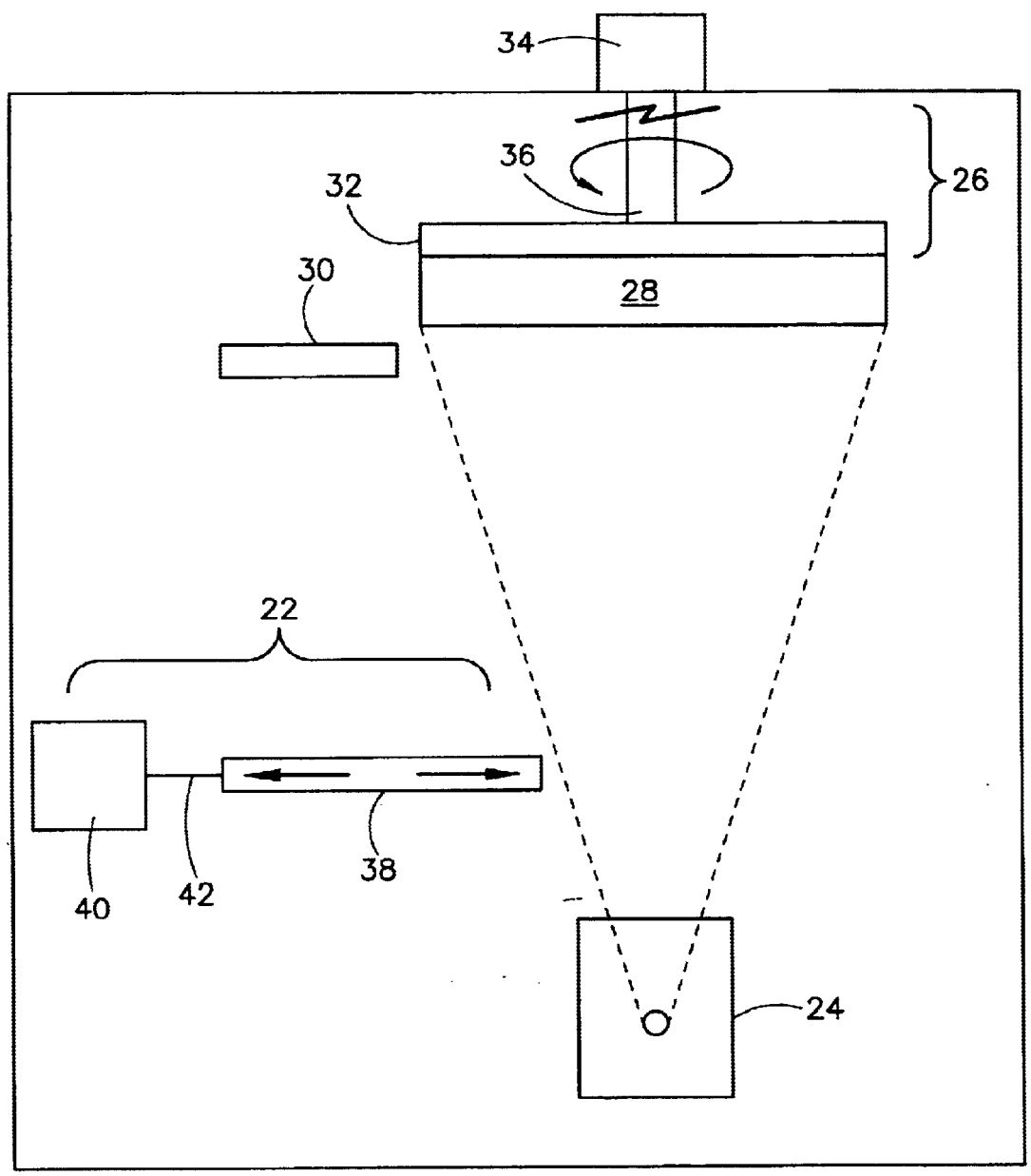
FIG. 1 is a diagram illustrating an example of a radial profile deposition apparatus in accordance with the invention.

The invention is particularly applicable to depositing a material onto a semiconductor wafer and it is in this context that the invention will be described. It will be appreciated, however, that the apparatus and method in accordance with the invention has greater utility since it can be used to deposit any type of material onto any type of substrate in which radial thickness or composition gradients or other arbitrary radial profiles are desirable. Prior to describing the invention, a glossary of terms being used in this application will be provided.

Glossary

The following terms are intended to have the following general meanings as they are used herein.

1. Substrate: A substrate is a material having a rigid or semi-rigid surface, with respect to the nature of the deposited material during deposition. In many embodiments, at least one surface of the substrate will be substantially flat, although in some embodiments it may be desirable to physically separate synthesis regions for different materials with, for example, dimples, wells, raised portions, etched trenches or the like. In some embodiments, the substrate itself may contain wells, raised regions, etched trenches, etc. which form all or part of the synthesis regions. The substrate may typically have a surface area of about 1 to 400 $cm^2$ and usually between 6 to 100 $cm^2$. However, it should be understood that the substrate may be substantially smaller or larger than the ranges depending on the particular application. For example, the substrate may have a surface area as small as about 0.1 to 1 $cm^2$ or as large as about 1 to 100 $m^2$. The substrate can be made of a convenient material depending on the components being deposited. For example, the substrate material may be a solid-state compound, an extended solid, an extended solution, a cluster of molecules or atoms, a crystal, etc. as described more fully in U.S. Pat. No. 5,776,359 which is incorporated herein by reference.

2. Target Material Source: A target material source is a piece of equipment which expels a target material from a target in order to direct the target material toward the substrate. The target material source may expel the target material from the target using a variety of different well known deposition techniques, such as thermal evaporation techniques, sputtering techniques, spraying techniques, laser deposition techniques, ion beam deposition, ion implantation or doping technique as well as other techniques used in the fabrication of integrated circuits and epitaxially grown materials, and preferable with line-of-sight techniques, such as thermal evaporation, electron beam deposition and low pressure sputtering.

3. Component: The term "component" may refer to each of the individual chemical substances that are deposited onto a substrate. The components may act upon one another to produce a particular material. The components may also react with each other, or be acted upon by a third material, chemical substance or energy source. A component may be an element from the periodic table, a chemical, a material, a mixture of elements or chemicals, etc. in variable stoichiometries. The components may react directly with each other or with an external source, or alternatively, they may form layers, blends, mixtures or combinations thereof.

4. Target Material: The term "target material" refers to material which can be composed of elements, compounds, chemicals, molecules, etc. that is vaporized, evaporated, boiled, sublimed, ablated, sprayed, etc. from the exit of a container or holder so that the target material may condense or otherwise deposit onto a substrate during the synthesis process. Generally, a component, as described above, is the set of individual chemical substances that are expelled from the target material to be deposited onto the substrate and the component may have the same composition as the target material or it may comprise a portion of the target material.

5. Mixture or Blend: The term "mixture" or "blend" may refer to a collection of molecules, ions, chemical substances, etc. The amount of each component in the mixture may be independently varied. A mixture may consist of two or more substances intermingled with no constant percentage composition wherein each component may or may not retain its essential original properties and molecular phase mixing may or may not occur. In the mixture, the components making up the mixture may or may not remain distinguishable from each other by virtue of their chemical structure.

6. Shutter: The term "shutter" may refer to a mechanism for blocking target material emitted by a target material source from being deposited onto the substrate. Typically, the shutter may be located in between the target material source and the substrate. In preferred embodiments, the shutter may be a plate associated with each target material source which may be moved relative to the target material being deposited onto the substrate in order to programmably block some predetermined portion of the target material at predetermined times. The shutter may be used to form composition profiles and/or gradients of target materials on the substrate. The system of shutters and associated mechanisms for moving the shutters for all of the target material sources may be referred to as a "shutter system".

7. Gradient: The term "gradient" refers to the fact that the amount of target material deposited on the substrate by the target material source may vary monotonically across some/ all of the substrate. The relationship between the particular amounts of target material deposited may vary to provide a variety of different gradients, such as, for example, a sloped gradient, a dam shaped gradient or a stepped gradient.

FIG. 1 is a diagram illustrating an example of a radial profile deposition apparatus 20 in accordance with the invention. The apparatus is able to generate various different radial profiles including radial fixed thickness profiles, mixtures of one or more target materials, linear gradients, non-linear gradients, symmetric profiles and asymmetric profiles. The apparatus 20 may include a shutter system 22 including one or more dynamic and independently movable and controllable shutters (one is shown in this example), a target material source 24, such as a physical vapor deposition (PVD) source or any other well known deposition source, that generates the deposition target material, a rotating platform 26 on which a substrate 28 is attached so that target material from the deposition source may be deposited onto the substrate in various radial profiles. The apparatus may further include a contact mask 30 that may be placed onto a portion of the substrate to block the deposition target material during the entire deposition process. The contact mask is shown in phantom since the contact mask may be moved around as needed or removed from the substrate depending on the desired profile. The contact mask 30 rotates with the substrate.

In more detail, the rotating platform 26 may further include a base portion 32 onto which the substrate is secured by any conventional means, a typical motor 34 and a shaft 36 connected between the motor and the base portion 32 in order to rotate the rotating platform. The speed and velocity of the rotation of the rotating platform may be precisely controlled (and optionally varied during the deposition process) to achieve particular profiles. The shutter system 22 may further include a shutter 38 that blocks the deposition material from contacting the substrate, a motorized linear drive system 40 and a shaft 42 connecting the drive system to the shutter so that each shutter may be independently moved and positioned or its speed is controlled in order to generate different profiles. In one embodiment, the drive system may be controlled by a computer to provide programmable shutter control. The same computer also may control the rotation of the substrate.

In accordance with the invention, the profiles generated on the substrate also are altered by changing the shape of each shutter, the speed and/or velocity profile of the shutter and/or the positions in which the shutter is placed during the deposition process and/or the velocity profile of the substrate rotation and/or the rate of deposition of the target material onto the substrate. Using the above apparatus, radial thickness or composition gradients or mixtures of target materials of a variety of profiles and essentially any arbitrary radial profile may be generated by controllably rotating the substrate and controlling the shutter system during the deposition. The apparatus is capable of generating a variety of different gradients and profiles since the shutter shapes, the shutter positions, the shutter motion profiles, the substrate rotation speed and the substrate rotation centricity (whether or not the substrate is rotated about its center) can all be independently controlled and adjusted to generate either continuous or discrete profiles of discrete compositional regions or other desired film thickness or composition profiles across the substrate.

Figure 2:
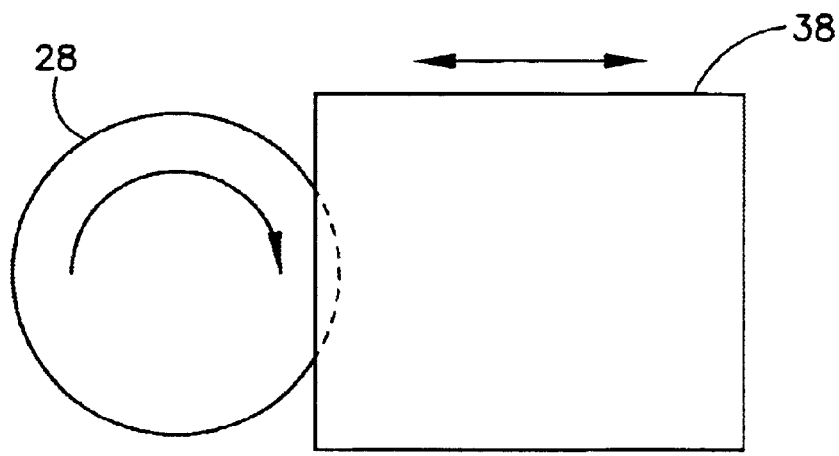
FIG. 2 is a diagram illustrating an example of the operation of the radial profile deposition apparatus in accordance with the invention.

As an example of a profile that may be generated, in FIG. 2 the substrate is mounted on the rotating platform so that the substrate rotates about its center and the single shutter may block ½ of the substrate initially. Then, the substrate is rotated during the deposition and the shutter is moved toward the edge of the substrate during the deposition. The movement of the shutter to expose more of the substrate during the deposition creates a conical gradient profile while moving the shutter to expose less of the substrate during deposition results in a gradient profile that is reverse conical (e.g., high at the edges of the substrate and lower in the center of the substrate.) Now, examples of the operation of the apparatus will be described.

Figure 3:
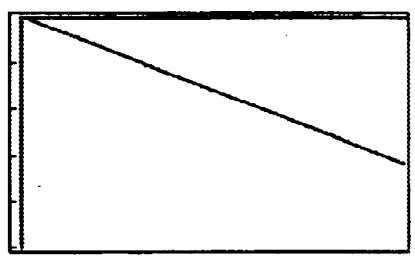
FIG. 3 illustrates an example of the slope of a gradient being generated by the operation of the apparatus shown in FIG. 1.
Figure 4A:
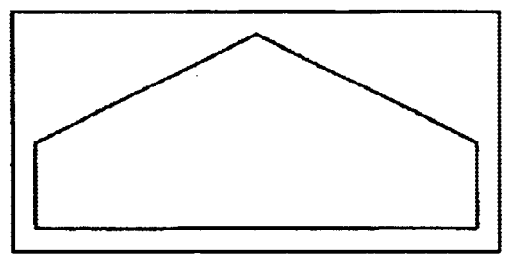
FIG. 4A illustrates another example of a gradient being generated by the operation of the apparatus shown in FIG. 1.

FIG. 2 is a diagram illustrating an example of the operation of the radial profile deposition apparatus in accordance with the invention. In this example, the substrate is rotatable about its center and is rotated during deposition, a single dynamic shutter 38 controlled by a computer is used and the target material deposition source (not shown) is capable of depositing uniformly to the entire substrate 28. In this example, the shutter moves at a constant velocity in a linear motion and the deposition begins when the shutter is at the edge of the substrate or beyond (and does not block the substrate) and stops when the shutter reaches the rotation center of the substrate. In this example, the film thickness slope is linear (as illustrated in FIG. 3) and the thickest point is at substrate rotation center. An example of the profile generated using this example is shown in FIG. 4A. If deposition starts when the edge of shutter is at the rotation center and stops when the shutter reaches or goes beyond the right edge of the substrate, the same pattern is created. Therefore, if the shutter is oscillating between the center of the substrate rotation and a point at or beyond the substrate edge, the same pattern, i.e., a mountain shape with linear slope, is generated as shown in FIG. 4A. FIGS. 4B–4E illustrate the motion of the shutter relative to the substrate at different times ($t_1$, $t_2$, $t_3$ and $t_4$) so that the mountain profile shown in FIG. 4A is generated. Now, another example of the operation of the apparatus will be described.

In this example of the operation of the apparatus, the shutter moves at a constant velocity and in a linear motion and the deposition begins when the shutter is within or at the substrate edge and stops before or at the moment the shutter reaches the substrate rotation center. The resultant film thickness slope is generally non-linear (as shown in FIGS. 5–7), but the thickest portion of the gradient profile is still at the center as shown in FIG. 8. In other words, the pattern or profile is a monotonically decaying curve. As in the example above, the reverse of the motions (e.g., starting at the center and stopping at the edge of the substrate) does not alter the character of the pattern. Therefore, oscillatory motion will also not alter the profile. In FIG. 5, the shutter starts at the edge of the substrate, but does not reach the center. In FIG. 6, the shutter starts at the center of the substrate, but does not reach the edge and in FIG. 7 the shutter moves between the center and edge of the substrate in an oscillatory motion. In accordance with the invention, to obtain a linear slope, the velocity profile of the shutter should generally be non-linear. This is also true for desired non-linear slope of thickness or composition profile. Obviously, the shutter is controlled by computer program hence almost any arbitrary profile can be created, as long as it is monotonically descending from rotation center to edge in this example. Now, another example of the operation of the apparatus will be described.

Figure 9:
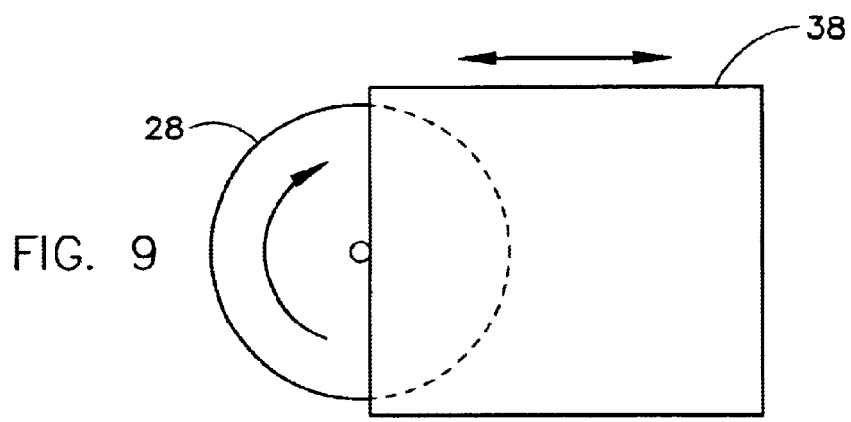
FIG. 9 is a diagram illustrating another example of the operation of the radial profile deposition apparatus in accordance with the invention.
Figure 10:
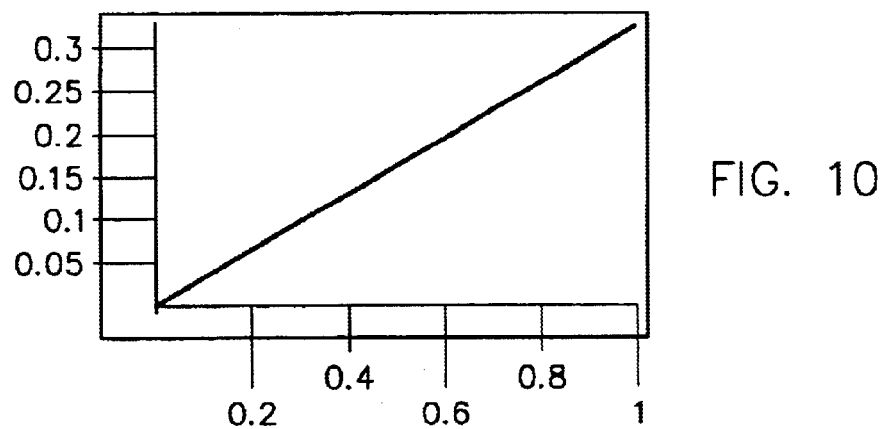
FIG. 10 illustrates a gradient profile with linear slope from the center of rotation to one edge of substrate (e.g., half of the substrate) generated by the example shown in FIG. 9 when the shutter starts from full blocking position and reaches the rotation center of the substrate.
Figure 11:
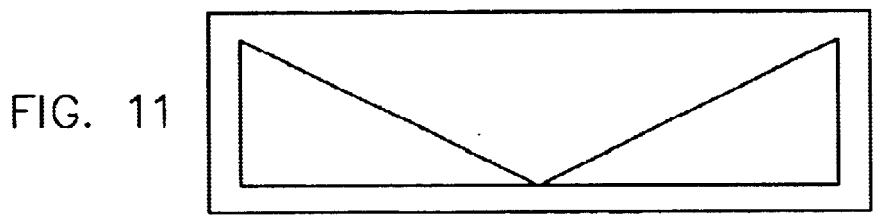
FIG. 11 illustrates the cross-sectional view of the gradient profile across the entire substrate generated by the example shown in FIG. 9 in accordance with operation of FIG. 10.

FIG. 9 is a diagram illustrating an example of the operation of the radial profile deposition apparatus in accordance with the invention. In this example, the shutter moves at a constant velocity (linear motion) and the deposition begins when the shutter is at or beyond the left edge of substrate and stops when the shutter reaches the center of the substrate rotation. The film thickness slope is linear (as shown in FIG. 10) and the thickest portion of the gradient profile is at substrate edge as shown in FIG. 11. The reverse of motion does not alter the pattern, nor does the oscillatory motion as above. Now, another example of the operation of the apparatus will be provided.

Figure 12:
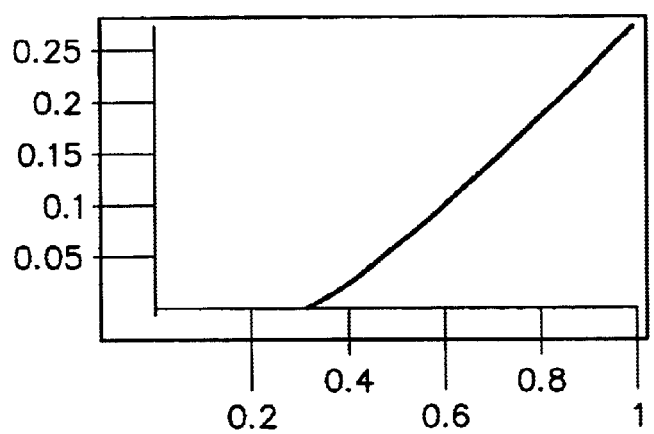
FIG. 12 illustrates a gradient profile from the center of rotation to one edge of substrate (e.g., half of the substrate) generated by the example shown in FIG. 9 when the shutter starts at the edge (full blocking of the substrate), but does not reach the center of the substrate.
Figure 13:
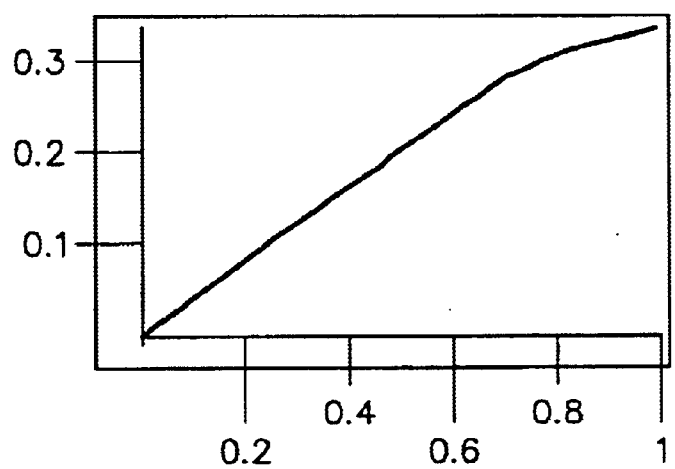
FIG. 13 illustrates a gradient profile from the center of rotation to one edge of substrate (e.g., half of the substrate) generated by the example shown in FIG. 9 when the shutter starts at the center but does not reach the edge of the substrate.
Figure 14:
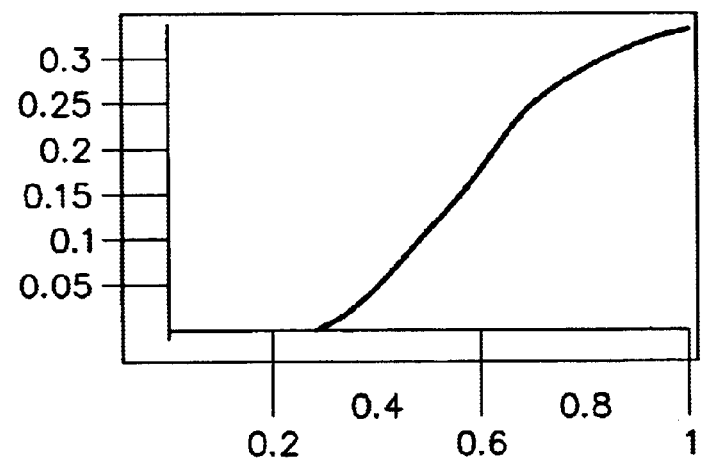
FIG. 14 illustrates a gradient profile from the center of rotation to one edge of substrate (e.g., half of the substrate) generated by the example shown in FIG. 9 when the shutter moves between the edge and center of the substrate.
Figure 15:
FIG. 15 illustrates a gradient profile across the entire substrate generated by the example shown in FIG. 9.

FIG. 12 illustrates the slope of the gradient generated by the example shown in FIG. 9 when the shutter starts at the edge, but does not reach the center of the substrate. In this example, the shutter moves at a constant velocity (linear motion) and the deposition begins when the shutter is at the substrate left edge and stops before the shutter reaches the substrate rotation center (from left, as in the picture). In this example, the film thickness slope is generally non-linear (as shown in FIG. 12) while the thickest portion of the gradient profile is still at the edge of the substrate as shown in FIG. 15. In other words, the pattern or profile is a valley shape with monotonically ascending curve. As in case 3, the reverse of the motion does not alter the character of the pattern. Therefore, oscillatory motion will also not alter the profile. FIG. 13 illustrates the slope of the gradient as deposition begins when the shutter is at the substrate rotation center but does not reach the substrate edge, and FIG. 14 illustrates the gradient slope when the shutter moves between the rotation center and edge of the substrate. In accordance with the invention, to obtain a linear slope, the velocity profile of the shutter should generally be non-linear. This is also true for desired non-linear slope of thickness or composition profile. Obviously, the shutter is controlled by computer program hence almost any arbitrary profile can be created, as long as it is monotonically ascending from rotation center to edge in this example.

The above examples demonstrate that even the simplest embodiment can create essentially any arbitrary profile as desired by means of stacking various basic profiles together. However, the more efficient way to generate arbitrary radial profiles, such as the profile shown in FIG. 16B, is to use a pair of dynamic shutters as shown in FIG. 16A. FIG. 16B illustrates an example of the profile generated using the two shutter system. FIG. 17 illustrates another setup that may generate the profile shown in FIG. 16B. When the two shutters are used during the deposition, each one is independently controlled by computer program, and one shutter is moved outwards and the other shutter is moved inwards to create essentially any desired thickness or composition profile having radial symmetry.

In accordance with the invention, other parameters of the radial profile deposition apparatus in accordance with the invention may be adjusted. For example, the substrate may be rotated off-center which will result in a different profile. In addition, more complex rotation patterns may be used, such as two or more simultaneous rotations about different axes of the substrate during the deposition. Furthermore, the substrate may be rotated through a predetermined angle less than one complete rotation, such as 180°, to determine which different tangential and radial points of the substrate receive the target material or target materials. Thus, the angular start point of the substrate, the rotation distance, the shutter velocity and position may be adjusted to generate various different profiles. Furthermore, the deposition rate (the rate at which the source supplies target material to the substrate) may be modified during the course of deposition, in a way that may or may not relate to shutter(s) position. For the clarity of description, all the above examples are given for a single source deposition. However, the method also works using the simultaneous co-deposition of multiple sources wherein each source has its own shutter system and creates its own and independent radial thickness or composition profile.

Figure 18:
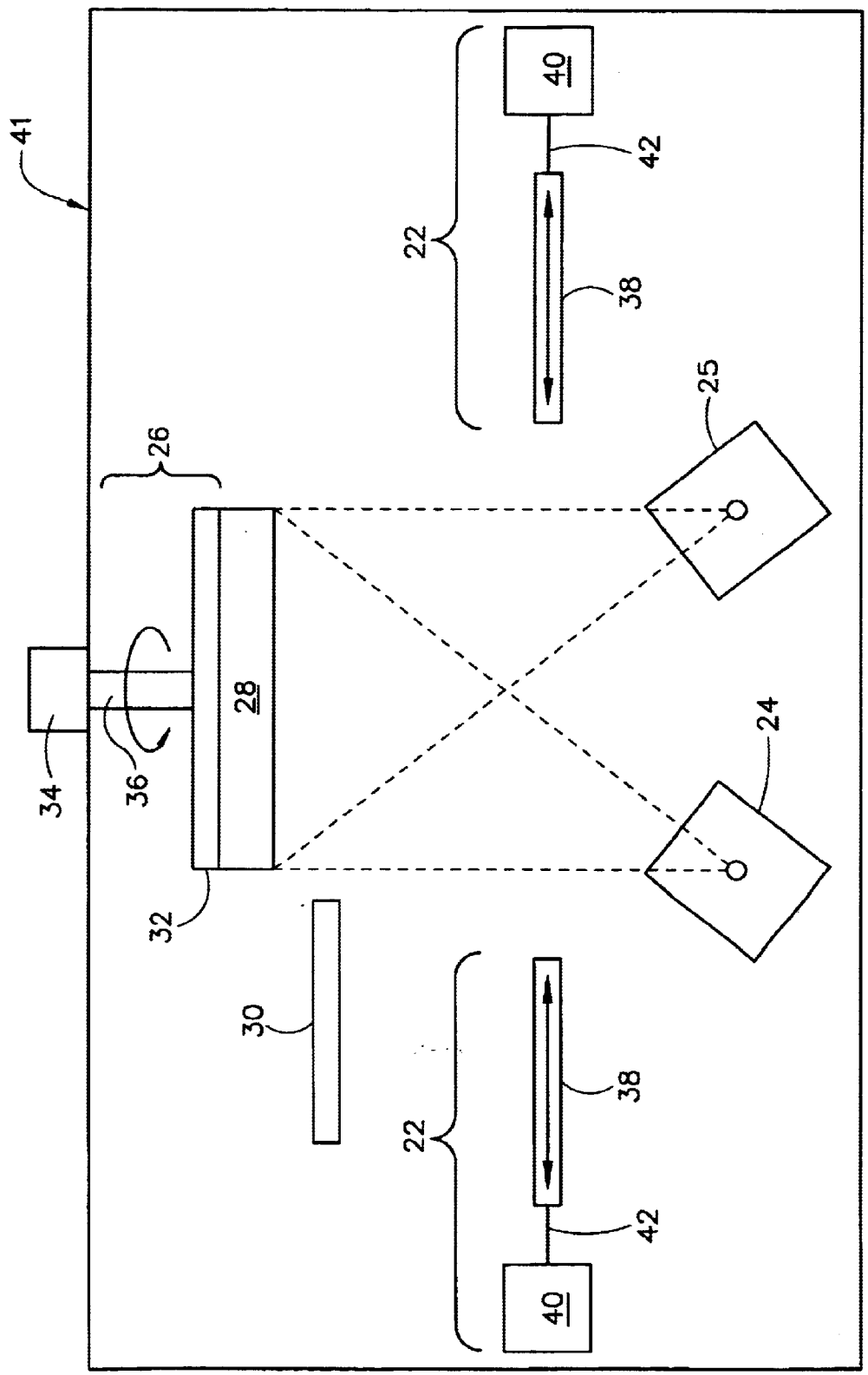
FIG. 18 illustrates a multiple target material source embodiment in accordance with the invention.

FIG. 18 illustrates a radial profile deposition source apparatus 41 wherein there are two or more target material sources 24, 25 that each direct target material toward the substrate 28 that is being rotated by the rotation platform 26. In this embodiment, there may be multiple shutter systems 22, 23 (one for each target material source) so that each target material's profile is independently controllable as described above. In this example shown, two target material sources are shown and two shutter systems are shown. In accordance with the invention, each target material source may have multiple shutters associated with it so that, for example, an annular ring of each target material may be formed on the substrate. The co-deposition of materials generally is described in more detail in U.S. Pat. No. 6,364,956 entitled "PROGRAMMABLE FLUX GRADIENT APPARATUS FOR CO-DEPOSITION OF MATERIALS ONTO A SUBSTRATE". The disclosure of that patent application is incorporated herein by reference. In such multiple sources applications, a shutter is placed in between the substrate and the deposition source it is associated with instead of the shutter being placed substantially near the substrate in the single source embodiment, so that the shutter will only block or pass material from the associated source interacting with the substrate but shall not block or affect any other sources interacting with the same substrate. This is generally shown in the above patent application that is incorporated herein by reference. Thus, during operation, while multiple sources are depositing various substances onto the substrate simultaneously, each substance is controlled individually and independently via its associated deposition source and shutter mechanism, as if it is single source deposition as described earlier.

Figure 19:
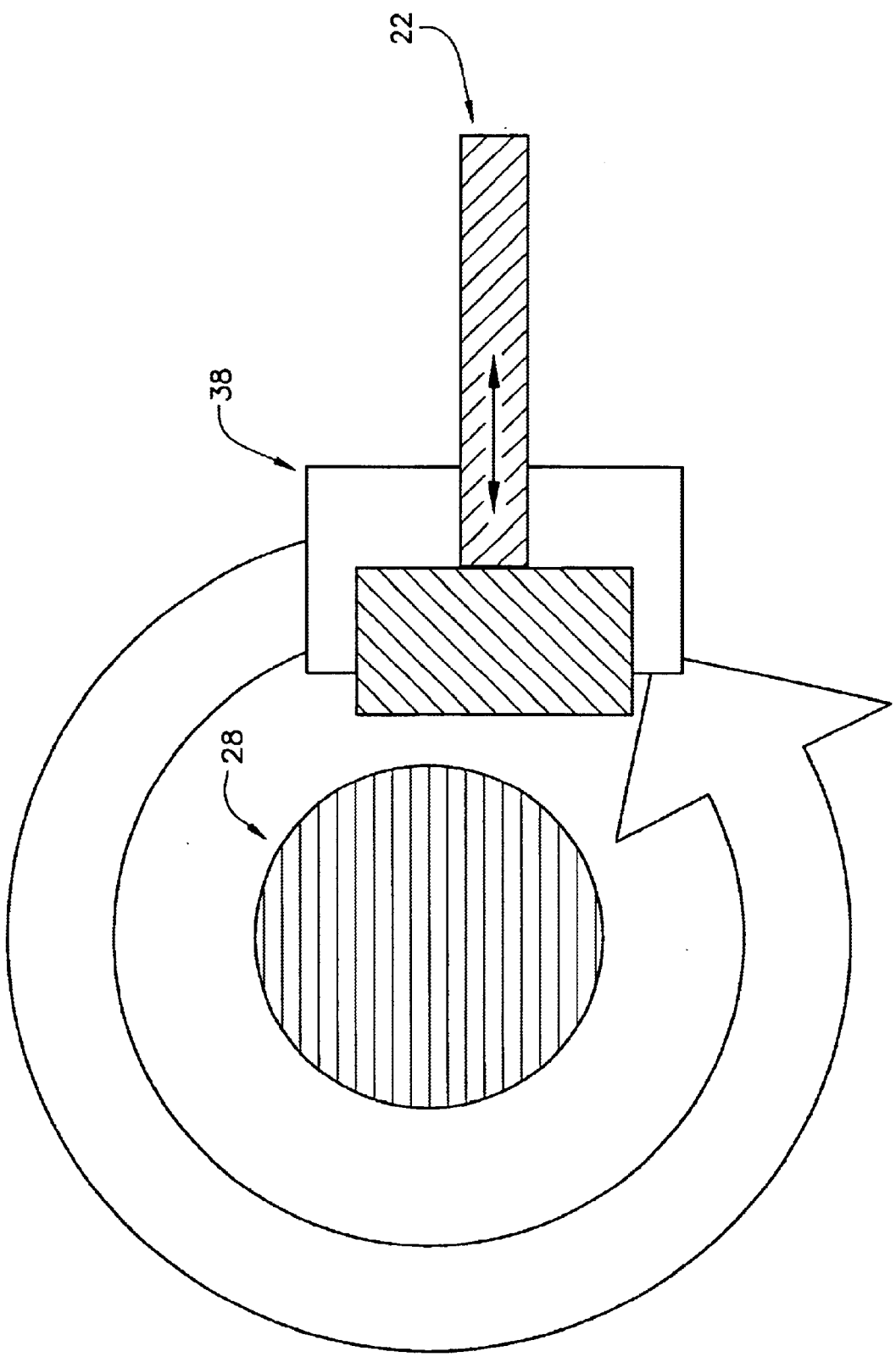
FIG. 19 illustrates another embodiment of the invention in which the shutter rotates.

FIG. 19 illustrates another embodiment of the invention. In this embodiment, the substrate 28 does not rotate while the shutter system rotates. Although a single shutter system 22 is shown, there may be multiple sources and multiple shutter systems to provide multiple source deposition of materials onto the substrate. Returning to FIG. 19, the substrate does not rotate and the shutter system 22 and the shutter 38 in particular, is rotated around the substrate as shown to produce the same radial thickness or composition gradients or other arbitrary radial profiles as may be generated by the other embodiments described above. In other words, this embodiment is also capable of generating the profiles shown and described above since one element of the deposition system is being rotated relative to the other elements of the deposition system which achieves the desired radial profiles and/or gradients.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. A method for depositing a radial profile of a target material onto a substrate, the method comprising:
   directing a target material toward a substrate;
   blocking some predetermined portion of the target material with a first shutter so that it does not strike the substrate; and
   rotating the substrate while the target material is directed toward the substrate so that a radial profile is formed on the substrate.

2. The method of claim 1, wherein the substrate is rotated and the first shutter does not rotate.

3. The method of claim 2, wherein the rotation is at a constant speed.

4. The method of claim 2, wherein the rotation is at a variable speed.

5. The method of claim 2, wherein the blocking further comprises moving the first shutter to change the amount of target material being blocked and the location of the target material on the substrate being blocked.

6. The method of claim 5, wherein the first shutter is moved to generate a gradient profile on the substrate.

7. The method of claim 5, wherein the first shutter moving is at a constant speed.

8. The method of claim 5, wherein the first shutter moving is at a variable speed.

9. The method of claim 5, wherein the first shutter is initially positioned to block the target material at the center of the substrate and then moves out toward the edge of the substrate while the substrate is rotated to form a conical profile.

10. The method of claim 5, wherein the first shutter is initially positioned to block the target material at the edge of the substrate and then moves in toward the rotation center of the substrate while the substrate is rotated.

11. The method of claim 5, wherein the first shutter is initially positioned to block the target material at the center of the substrate and then moves out toward the edge of the substrate to expose less of the substrate while the substrate is rotated to form a reverse conical profile.

12. The method of claim 2 further comprising blocking a second portion of the target material using a second shutter that is independently movable relative to the first shutter.

13. The method of claim 12, wherein the first and second shutters are fixed in position during the deposition to generate an annular ring on the substrate.

14. The method of claim 12, wherein the second shutter is rotated during the deposition to generate an annular ring of target material on the substrate.

15. The method of claim 12, wherein the first and second shutters are initially positioned at opposite edges of the substrate and then both move in toward each other and toward the center of the substrate.

16. The method of claim 12, wherein the first and second shutters are initially positioned at the center of the substrate and then both move out away from each other and toward the opposite edges of the substrate.

17. The method of claim 2 further comprising directing one or more additional target material onto the substrate.

18. The method of claim 1, wherein the substrate is rotated off-center.

19. The method of claim 1, wherein the rotation comprises two or more simultaneous rotations about different axes of the substrate during the deposition.

20. The method of claim 1, wherein the substrate is rotated through a predetermined angle less than one complete rotation.

21. The method of claim 1, wherein the deposition rate varies during the course of deposition.

22. A method for depositing a radial profile of a target material onto a substrate, the method comprising:
   directing a target material toward a substrate;
   blocking some predetermined portion of the target material with a first shutter so that it does not strike the substrate; and
   rotating the first shutter around the substrate while the target material is directed toward the substrate so that a radial profile is formed on the substrate.

23. The method of claim 22, wherein the first shutter is initially positioned to block the target material at the center of the substrate and then moves out toward the edge of the substrate while the first shutter is rotated to form a conical profile.

24. The method of claim 22, wherein the first shutter is initially positioned to block the target material at the edge of the substrate and then moves in toward the rotation center of the substrate while the first shutter is rotated.

25. The method of claim 22 further comprising blocking a second portion of the target material using a second shutter that is independently movable relative to the first shutter.

26. The method of claim 25, wherein the first and second shutters are rotated during the deposition to generate an annular ring on the substrate.

27. The method of claim 25, wherein the first and second shutters are initially positioned at opposite edges of the substrate and then both move in toward each other and toward the center of the substrate.

28. The method of claim 27, wherein the first and second shutters are initially positioned at the center of the substrate and then both move out away from each other and toward the opposite edges of the substrate.

29. The method of claim 22 further comprising directing one or more additional target material onto the substrate.

30. The method of claim 22, wherein the substrate does not rotate.

31. The method of claim 22, wherein the deposition rate varies during the course of deposition.

* * * * *